(12) United States Patent
Arai et al.

(10) Patent No.: US 6,876,067 B2
(45) Date of Patent: Apr. 5, 2005

(54) SEMICONDUCTOR DEVICE

(75) Inventors: Taiga Arai, Hitachi (JP); Fujiaki Nose, Ome (JP); Hiroshi Kikuchi, Hidaka (JP); Yoichi Tamaki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/396,360

(22) Filed: Mar. 26, 2003

(65) Prior Publication Data

US 2003/0222281 A1 Dec. 4, 2003

(30) Foreign Application Priority Data

Mar. 29, 2002 (JP) ........................................ 2002-093625

(51) Int. Cl.[7] .......................................... H01L 23/495
(52) U.S. Cl. ...................... 257/666; 257/666; 257/669
(58) Field of Search ................................ 257/666, 669, 257/706, 59, 676, 687, 675; 428/615

(56) References Cited

U.S. PATENT DOCUMENTS

| | | | | |
|---|---|---|---|---|
| 5,041,902 A | * | 8/1991 | McShane | 257/706 |
| 5,525,824 A | * | 6/1996 | Himi et al. | 257/370 |
| 6,139,977 A | * | 10/2000 | Abys et al. | 428/615 |
| 6,198,163 B1 | * | 3/2001 | Crowley et al. | 257/706 |
| 6,429,512 B1 | * | 8/2002 | Huang et al. | 257/706 |
| 6,512,244 B1 | * | 1/2003 | Ju et al. | 257/59 |

FOREIGN PATENT DOCUMENTS

| | | |
|---|---|---|
| JP | 7-335811 | 12/1995 |
| JP | 11-284119 | 10/1999 |

* cited by examiner

Primary Examiner—David Nelms
Assistant Examiner—Thinh T Nguyen
(74) Attorney, Agent, or Firm—Miles & Stockbridge P.C.

(57) ABSTRACT

A semiconductor device improved in reliability is disclosed. The semiconductor device comprises a semiconductor chip, a sealing member which seals the semiconductor chip with resin, a tub having a chip bonding surface for bonding with the chip and a back surface located on the side opposite to the chip bonding surface and exposed to a surface of the sealing member, plural inner leads electrically connected respectively to bonding pads on the semiconductor chip through wires such as gold wires, and plural outer leads integrally connected respectively to the inner leads and projecting to the exterior of the sealing member, wherein surfaces of the tub and the plural inner and outer leads are all coated with palladium plating. In the case where a heat radiation member is attached to the back surface of the tub, the palladium plating does not melt during solder reflow for example, so that the heat radiation member can be prevented from falling off and hence it is possible to improve the reliability of a QFP as the semiconductor device.

13 Claims, 12 Drawing Sheets

SEMICONDUCTOR DEVICE

BACKGROUND OF THE INVENTION

The present invention relates to a semiconductor device manufacturing technique and more particularly to a technique applicable effectively to the improvement of heat radiating performance of a semiconductor device which is assembled using a lead frame.

In a resin-sealed type semiconductor device which is assembled using a lead frame, if it carries thereon a power IC (Integrated Circuit) which generates a large quantity of heat, it is necessary to improve the heat radiating performance of the semiconductor device.

As to a heat radiation structure of a semiconductor device, a description thereof is found, for example, in Japanese Published Unexamined Patent Application No. Hei 11(1999)-284119. In this publication there is disclosed a technique in which a tub (a chip mounting portion) with a semiconductor chip mounted thereon is exposed to the surface of sealing resin to improve the heat radiating performance.

SUMMARY OF THE INVENTION

Having made a study about the provision of a heat radiating member such as heat radiating fins or a thermal diffusion plate on the back surface of the tub with the intention of further improving the heat radiating performance, the present inventor found out the following problems.

First, if a heat radiation member is mounted using solder plating as exterior plating of a lead frame, there arises the problem that the solder melts at the time of solder reflow to a mounting substrate, with deteriorated reliability in the mounting of the heat radiation member and consequent deterioration of the heat radiating performance.

Further, if there is used another bonding material (e.g., a thermally conductive silicone adhesive) different from solder plating, there arises the problem that the material cost and the assembling cost increase.

In Japanese Published Unexamined Patent Application No. Hei 11(1999)-284119 there is not found any description about a concrete method for mounting a heat sink to a tub.

It is an object of the present invention to provide a semiconductor device improved in reliability and a method of manufacturing the same.

It is another object of the present invention to provide a semiconductor device reduced in cost and a method of manufacturing the same.

It is a further object of the present invention to provide a semiconductor device reduced in size and a method of manufacturing the same.

The above and other objects and novel features of the present invention will become apparent from the following description and the accompanying drawings.

Typical modes of the present invention will be outlined below.

In one aspect of the present invention there is provided a semiconductor device comprising a semiconductor chip, a sealing member which seals the semiconductor chip with resin, a tub having a chip bonding surface and a back surface located on the side opposite to the chip bonding surface, the back surface being exposed to the sealing member, plural inner leads electrically connected respectively to surface electrodes of the semiconductor chip, and plural outer leads integrally connected to the inner leads respectively and projecting to the exterior of the sealing member, wherein the back surface of the tub is plated with palladium.

In another aspect of the present invention there is provided a method of manufacturing a semiconductor device, comprising the steps of providing a lead frame the whole surface of which is plated with palladium, bonding a chip bonding surface of a tub with a semiconductor chip, connecting surface electrodes of the semiconductor chip and corresponding inner leads with each other using metal thin wires, sealing the semiconductor chip with resin so that a surface of the tub located on the side opposite to the chip bonding surface is exposed, to form a sealing member, and cutting plural outer leads, allowing a base metal to be exposed to end faces of the outer leads, and separating each of the outer leads from the lead frame.

DETAILED DESCRIPTION OF THE PREFERRED EMBODIMENTS

Figure 1:
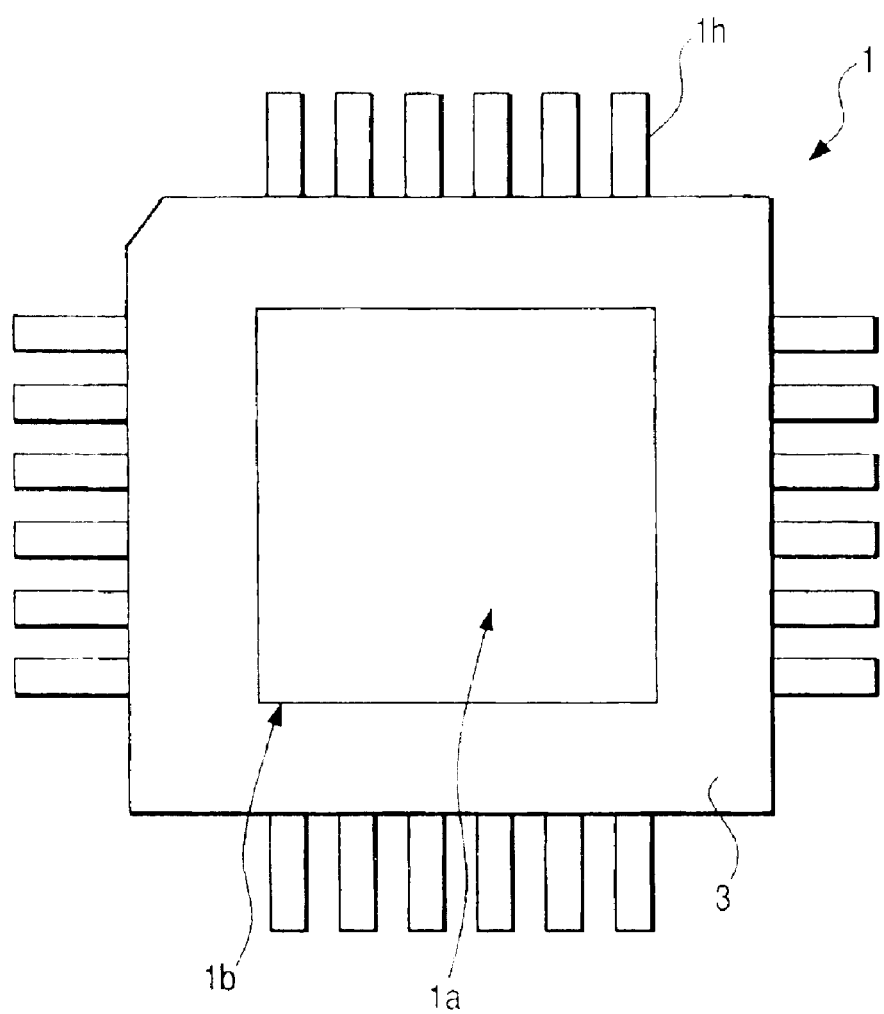
FIG. 1 is a plan view showing a structural example of a semiconductor device according to a first embodiment of the present invention.

Embodiments of the present invention will be described in detail hereinunder with reference to the accompanying drawings. In all of the drawings for illustration of the embodiments, components having the same functions are identified by like reference numerals, and repeated explanations thereof will be omitted.

(First Embodiment)

Figure 2:
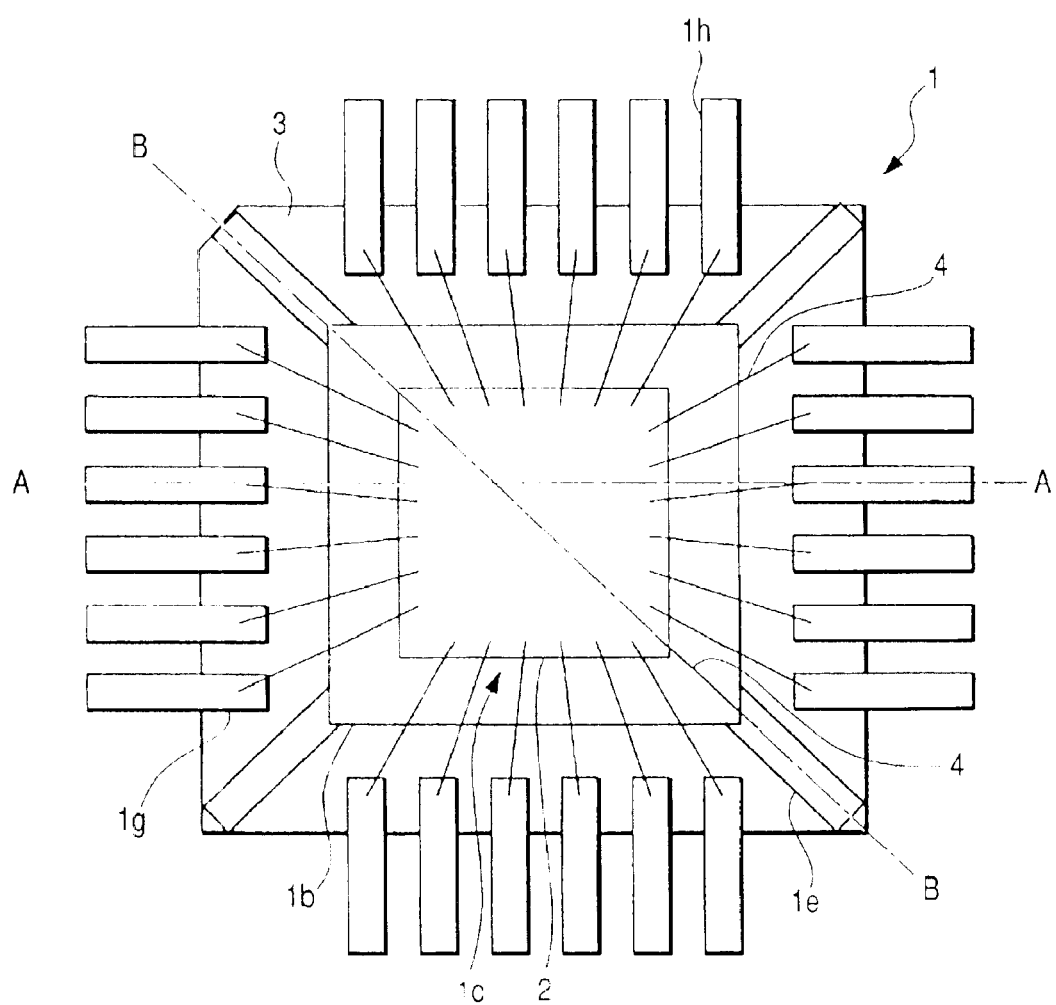
FIG. 2 is a bottom view showing an internal structure in the structural example of the semiconductor device illustrated in FIG. 1 as seen through a sealing member.
Figure 3:
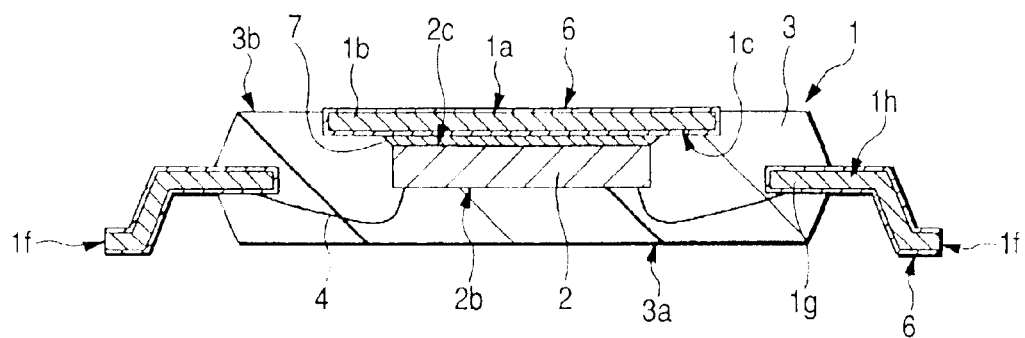
FIG. 3 is a sectional view taken along line A—A in FIG. 2.
Figure 4:
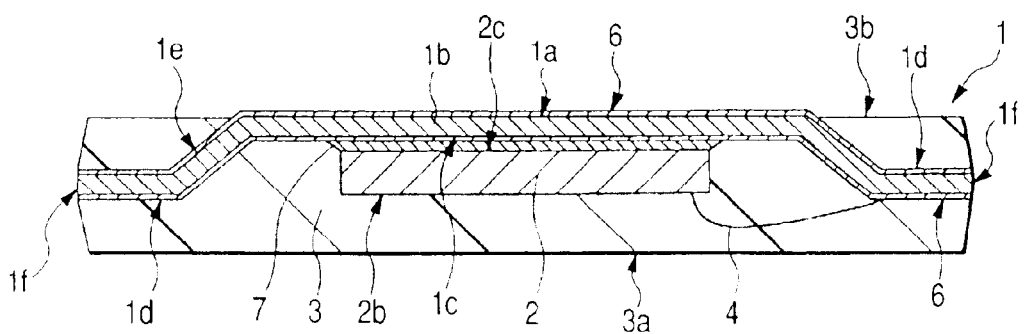
FIG. 4 is a sectional view taken along line B—B in FIG. 2.
Figure 5:
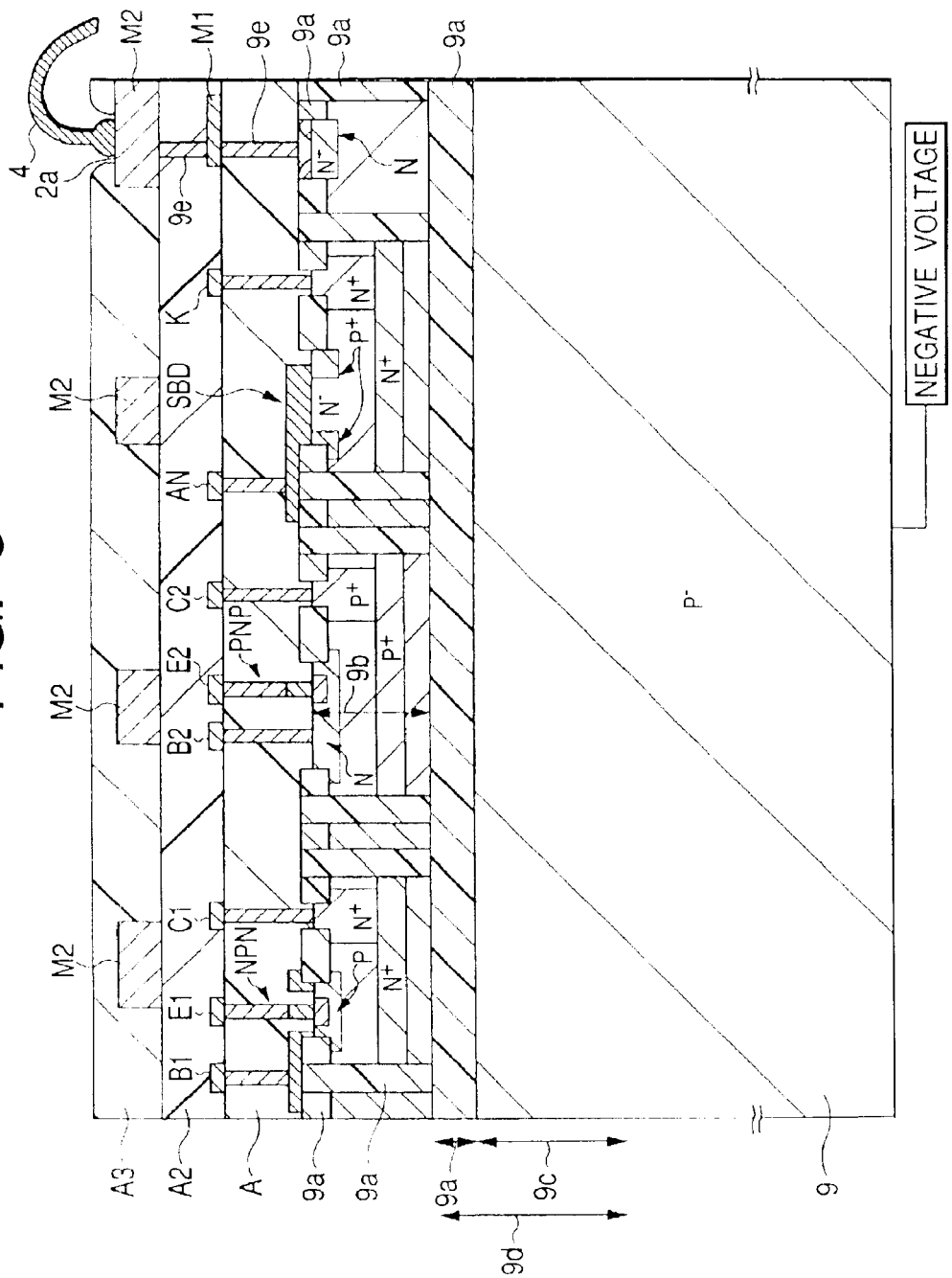
FIG. 5 is an enlarged partial sectional view showing an example of an internal structure of a semiconductor chip mounted on the semiconductor device illustrated in FIG. 1.
Figure 6:
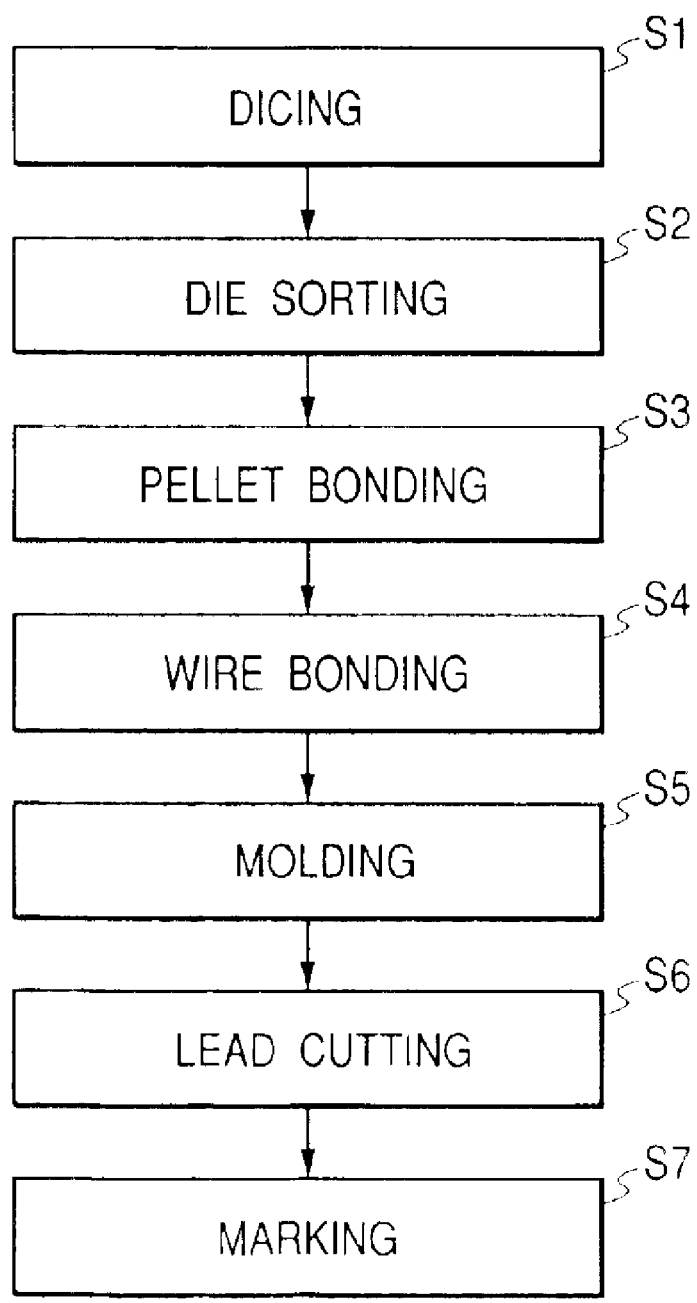
FIG. 6 is a manufacturing process flow chart showing an example of a procedure for assembling the semiconductor device illustrated in FIG. 1.
Figure 7:
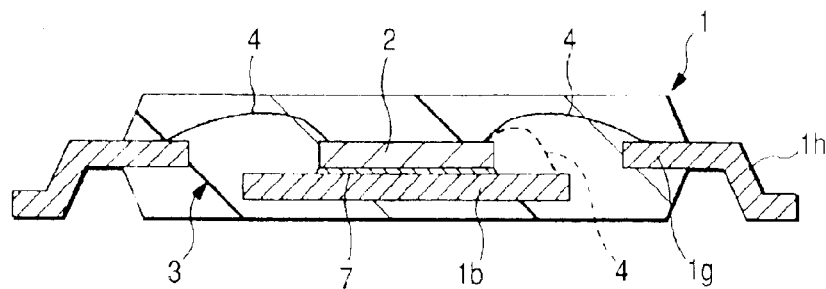
FIG. 7 is a sectional view showing the structure of a semiconductor device according to a modification of the first embodiment of the invention.
Figure 8:
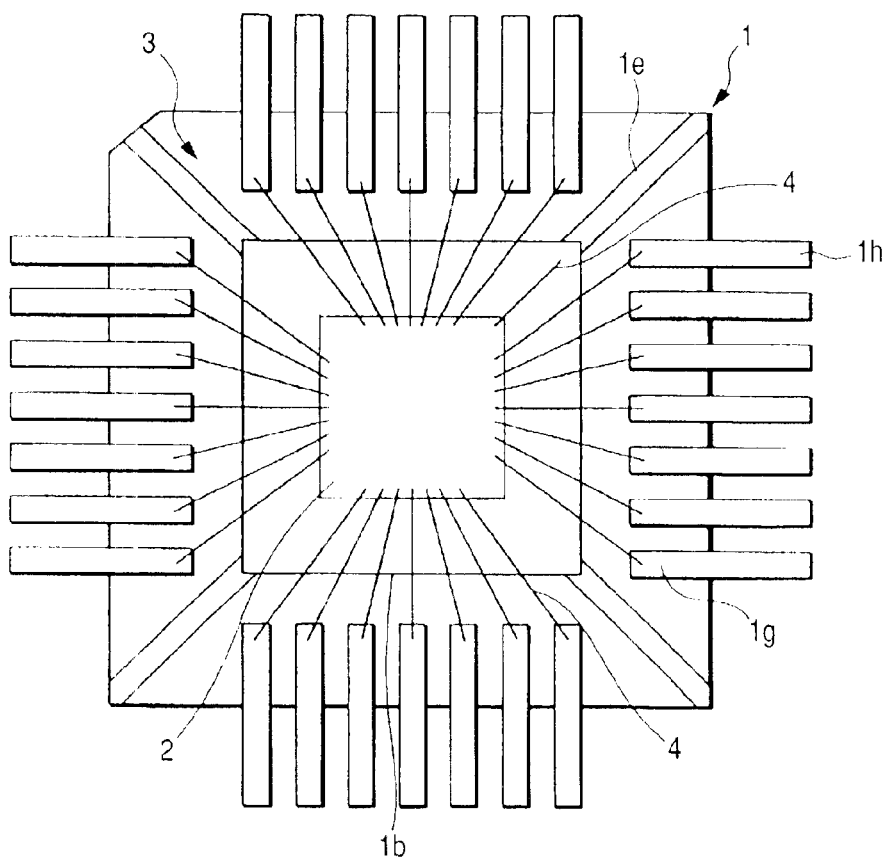
FIG. 8 is a plan view showing an internal structure of the semiconductor device illustrated in FIG. 7 as seen through a sealing member.
Figure 9:
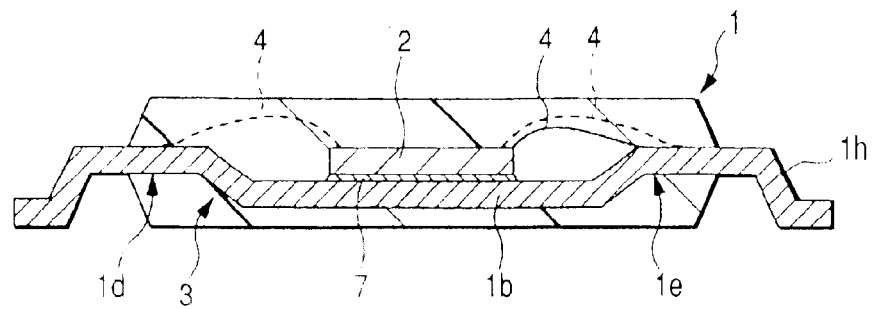
FIG. 9 is a sectional view taken along line C—C in FIG. 10.
Figure 10:
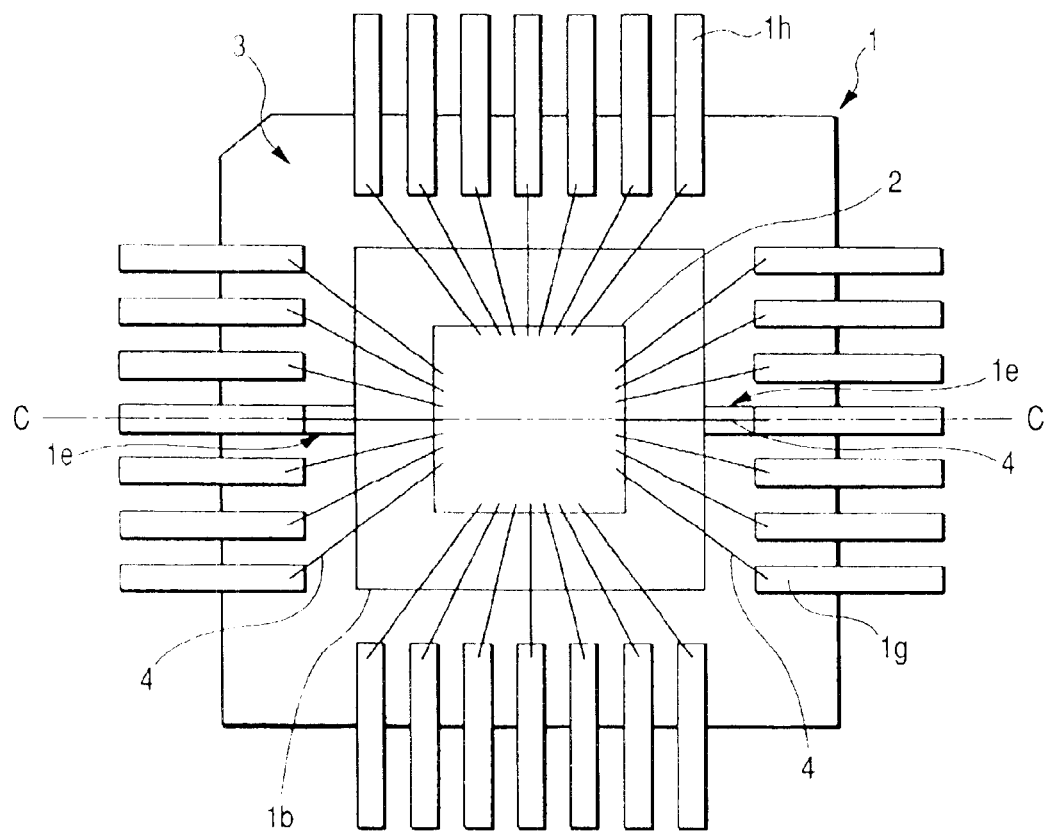
FIG. 10 is a plan view showing an internal structure of a semiconductor device according to another modification of the first embodiment of the invention as seen through a sealing member.
Figure 11:
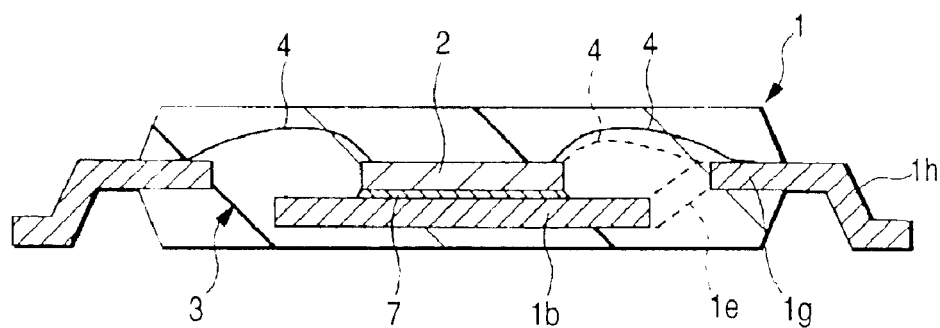
FIG. 11 is a sectional view showing the structure of a semiconductor device according to a further modification of the first embodiment of the invention.
Figure 12:
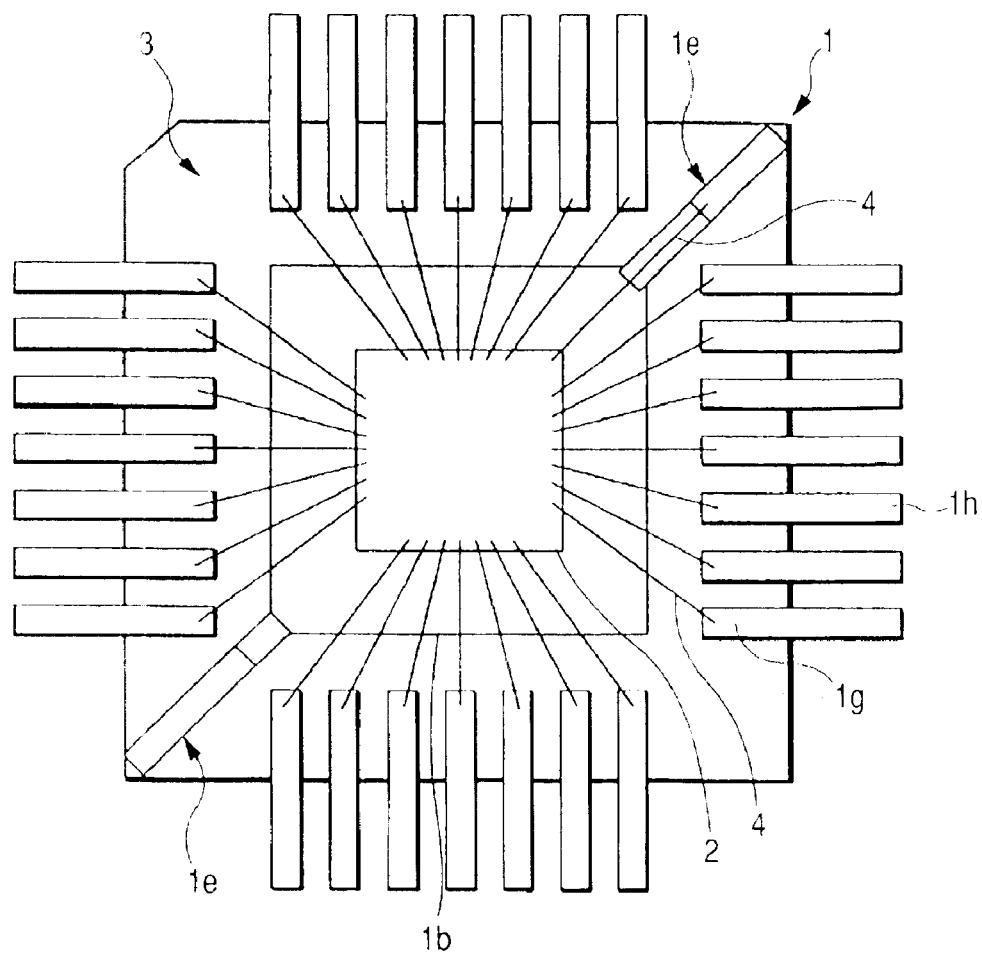
FIG. 12 is a plan view showing an internal structure of the semiconductor device illustrated in FIG. 11 as seen through a sealing member.
Figure 13:
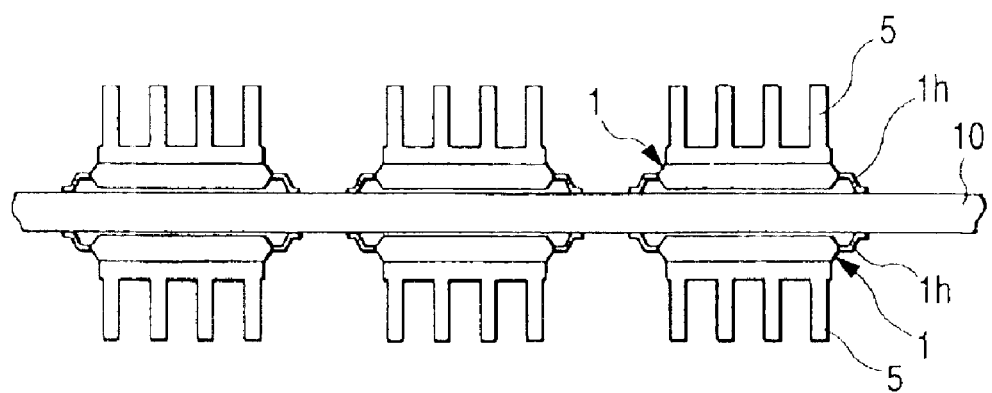
FIG. 13 is a side view showing an example of a mounted state of the semiconductor device according to the first embodiment of the invention.
Figure 14:
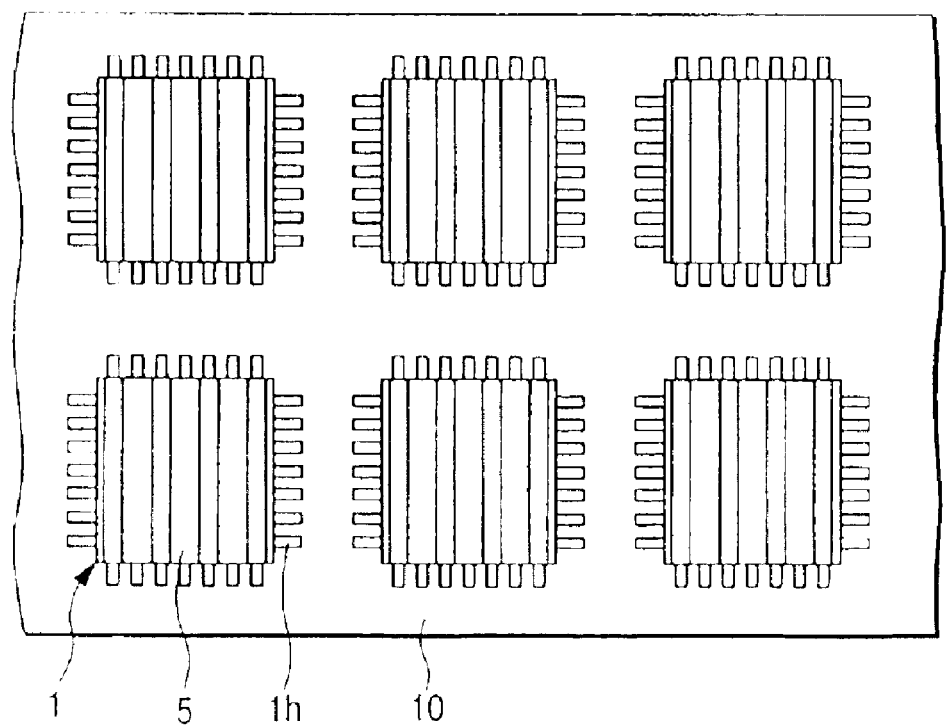
FIG. 14 is a plan view of the mounted state shown in FIG. 13.
Figure 15:
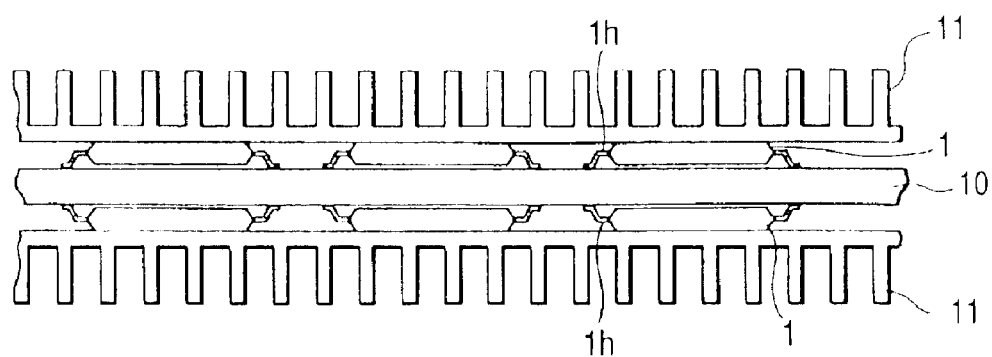
FIG. 15 is a side view showing another example of a mounted state of the semiconductor device according to the first embodiment of the invention.
Figure 16:
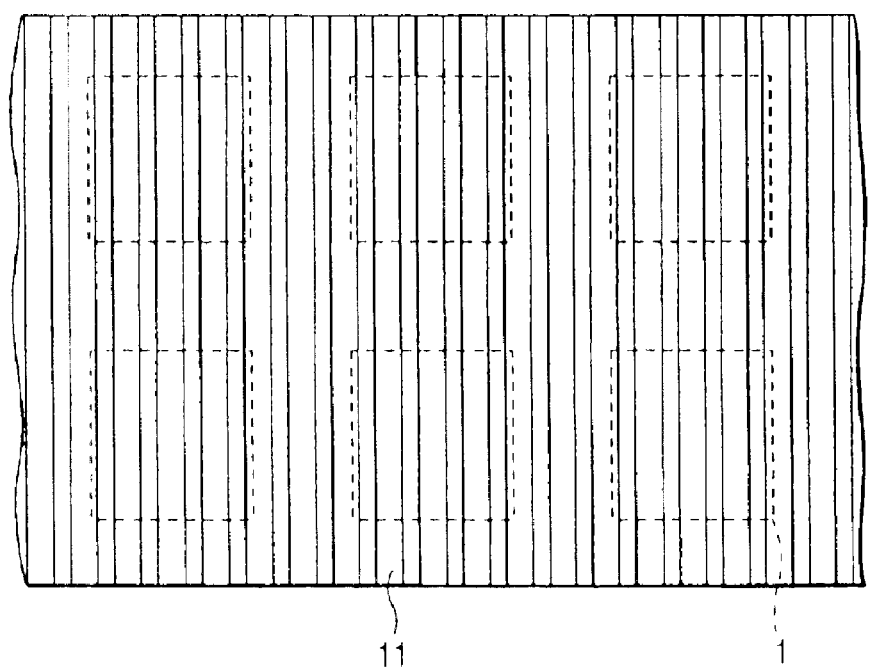
FIG. 16 is a plan view of the mounted state shown in FIG. 15.

FIG. 1 is a plan view showing an example of a structure of a semiconductor device according to a first embodiment of the present invention, FIG. 2 is a bottom view showing an internal structure of the semiconductor device illustrated in FIG. 1 as seen through a sealing member, FIG. 3 is a sectional view taken along line A—A in FIG. 2, FIG. 4 is a sectional view taken along line B—B in FIG. 2, FIG. 5 is an enlarged partial sectional view showing an example of an internal structure of a semiconductor chip mounted on the semiconductor device illustrated in FIG. 1, FIG. 6 is a manufacturing process flow chart showing an example of a procedure for assembling the semiconductor device shown in FIG. 1, FIG. 7 is a sectional view showing the structure of a semiconductor device according to a modification of the first embodiment of the invention, FIG. 8 is a plan view showing an internal structure of the semiconductor device illustrated in FIG. 7 as seen through a sealing member, FIG. 9 is a sectional view taken along line C—C in FIG. 10, FIG. 10 is a plan view showing an internal structure of a semiconductor device according to another modification of the first embodiment of the invention as seen through a sealing member, FIG. 11 is a sectional view showing the structure of a semiconductor device according to a further modification of the first embodiment of the invention, FIG. 12 is a plan view showing an internal structure of the semiconductor device illustrated in FIG. 11 as seen through a sealing member, FIG. 13 is a side view showing an example of a mounted state of the semiconductor device according to the first embodiment of the invention, FIG. 14 is a plan view of the mounted state shown in FIG. 13, FIG. 15 is a side view showing another example of a mounted state of the semiconductor device according to the first embodiment of the invention, and FIG. 16 is a plan view of the mounted state shown in FIG. 15.

A semiconductor device according to a first embodiment of the present invention, which is illustrated in FIGS. 1 to 4, is a resin-sealed type semiconductor QFP (Quad Flat Package) 1 assembled using a lead frame with outer leads 1h bent in a gull wing shape.

Further, a power IC which generates a large amount of heat is mounted on the semiconductor package and thus this semiconductor package is required to improve its heat radiating performance.

The QFP 1 is made up of a semiconductor chip 2 with a semiconductor integrated circuit formed thereon, a sealing member 3 for sealing the semiconductor chip 2 with resin, a tub 1b whose back surface 1a located on the side opposite to a chip bonding surface 1c thereof for bonding with the semiconductor chip 2 is exposed to a surface 3b of the sealing member 3, plural inner leads 1g connected electrically through wires (metal thin wires) 4 such as gold wires to bonding pads 2a shown in FIG. 5 which are surface electrodes of the semiconductor chip 2, and plural outer leads 1h integrally connected to the inner leads 1g respectively and projecting to the exterior of the sealing member 3. The surfaces of the tub 1b and the plural inner leads 1g and outer leads 1h are all coated with palladium plating 6.

However, cut faces 1f of the outer leads 1h and cut faces (end faces) if of suspending leads 1e for supporting the tub 1b are not coated with palladium plating 6, but a base metal is exposed.

As shown in FIG. 1, the QFP 1 of this first embodiment is of a structure in which the back surface 1a of the tub 1b is exposed to a surface 3b side of the sealing member 3.

According to this structure, the heat generated by the semiconductor chip 2 can be radiated to the exterior through the back surface 1a of the tub 1b, whereby it is possible to improve the heat radiating performance of the QFP 1 and hence improve the reliability thereof.

The palladium plating 6 may be of a laminate structure such as, for example, palladium plating/nickel plating.

In the semiconductor chip 2, as shown in FIG. 3, a main surface 2b thereof faces a back surface (mounting-side surface) 3a of the sealing member 2b, and a back surface 2c thereof located on the side opposite to the main surface 2b is bonded to the chip bonding surface 1c of the tub 1b through Ag paste 7.

Thus, the semiconductor chip 2 underlies the tub 1b, the back surface 1a of the tub 1b is exposed to the surface 3b side of the sealing member 3, and the exposed back surface 1a of the tub 1b is coated with palladium plating 6.

Figure 19:
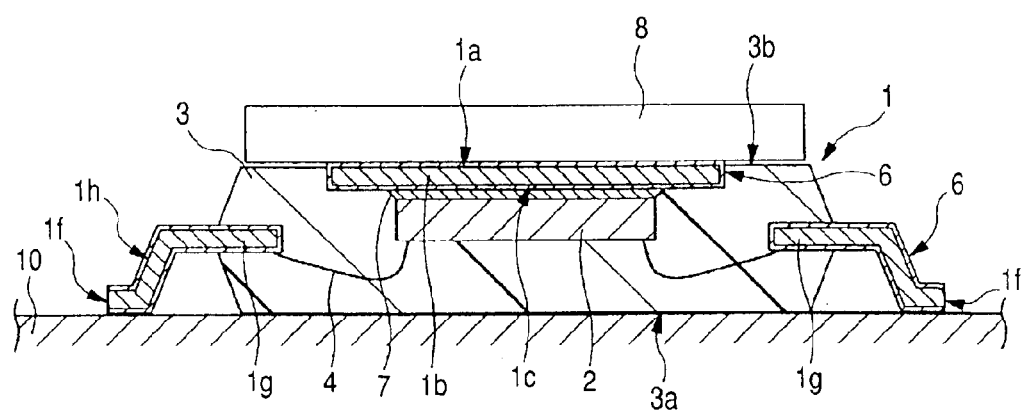
FIG. 19 is a sectional view showing the structure of a semiconductor device according to another modification of the second embodiment of the invention.

Since the back surface 1a of the tub 1b is thus exposed to the surface 3b side of the sealing member 3, a sufficient space is ensured on the surface 3b side of the sealing member 3 in comparison with the back surface 3a side, so that it is possible to install heat radiation members of various shapes and sizes such as a heat radiation fin 5 shown in FIG. 13, a large-sized heat radiation fin 11 shown in FIG. 15, and a thermal diffusion plate 8 shown in FIG. 19. Thus, the heat radiation (cooling) method for QFP 1 can be made versatile.

Unlike heat radiation to a mounting substrate 10 (see FIG. 13), the heat generated is radiated to above the sealing member 3, so it is possible to diminish the influence of heat on peripheral components of QFP 1 on the mounting substrate 10 and hence possible to improve the packaging density on the periphery side of QFP 1.

In other words, it is possible to decrease the mounting area for the packaging substrate 10 and hence possible to not only improve the mounting efficiency but also attain the reduction of product size and consequent reduction of product cost.

Besides, since the heat from the semiconductor chip 2 can be radiated efficiently, it is possible to prevent device characteristics from being changed by temperature and hence possible to improve the reliability of QFP 1.

In the QFP 1 of this first embodiment, moreover, since the surfaces of leads are all coated with palladium plating 6 except the cut faces of outer leads 1h and suspension leads 1e, it is possible to realize a lead-free state.

Further, the exposed back surface 1a of the tub 1b is coated with palladium plating 6, so at the time of installing a heat radiation member such as a heat radiation fin 5 or a large-sized heat radiation fin 11, connection can be made by palladium plating 6, not by solder.

Accordingly, when solder is melted for replacement with another part at the time of repair for example after the QFP 1 has been mounted onto the packaging substrate 10, such a heat radiation member as a heat radiation fin 5 or a large-sized heat radiation fin 11 can be prevented from coming off the QFP body because palladium plating 6 is higher in melting point than solder and does not melt.

As shown in FIG. 4, the QFP 1 has stepped portions 1d formed by bending the suspension leads 1e which support the tub 1b. The stepped portions 1d are embedded in the sealing member 3.

Although the back surface 1a of the tub 1b is exposed to the surface 3b of the sealing member 3, the suspension leads 1e are bent so as to be equal in height to the inner leads 1g, whereby the stepped portions 1d are formed. Consequently, the stepped portions 1d are in an embedded state into the sealing member 3.

Thus, since the suspension leads 1e are formed with stepped portions 1d by bending and the stepped portions 1d are embedded in the sealing member 3, it is possible to increase the area of bonding between the sealing resin and the suspension leads 1e and thereby improve the bonding force between the tub 1b and the sealing resin and hence improve the reliability.

Further, since the suspension leads 1e are formed with stepped portions 1d and the stepped portions embedded in the sealing member 3, it is possible to make long a water entry path from the tub 1b into the sealing member 3 and hence possible to improve the moisture resistance.

Moreover, the stepped portions 1d of the suspension leads 1e act as walls to prevent the Ag paste 7 from flowing out onto the suspension leads 1e. Therefore, also at the time of bonding wires 4 to the suspension leads 1e, the bonding can be effected because the palladium plating 6 on the suspension leads 1e is not covered with the Ag paste 7.

As shown in FIG. 5, a semiconductor chip 2 formed from an SOI (Silicon On Insulator) substrate is incorporated in the QFP 1 of this first embodiment.

Further, a predetermined pad 2a formed on the semiconductor chip 2 is electrically connected through wire 4 to a suspension lead 1e for the tub 1b which lead is coated with palladium plating 6, and a negative voltage is applied from the pad 2a on the semiconductor chip 2 to the back surface 2c of a semiconductor substrate (base substrate) 9 through the wire 4 and the tub 1b.

The semiconductor chip 2 of SOI structure shown in FIG. 5 has a P$^-$ type semiconductor substrate 9 as a base substrate, a semiconductor layer 9b formed on the semiconductor substrate 9 through an insulating layer 9a, and a semiconductor element formed on the semiconductor layer 9b.

For example, the semiconductor substrate 9 as a base substrate is formed by P$^-$ type single crystal silicon (Si) and possesses a function of ensuring a mechanical strength of the SOI substrate. For example, the insulating layer 9a is formed by silicon oxide film and the semiconductor layer 9b is formed by single crystal silicon.

In an isolation region of a device forming surface as a main surface of the semiconductor layer 9b are formed a shallow isolation and a trench isolation. For example, the shallow isolation is formed by silicon oxide film in accordance with a LOCOS (Local Oxidization of Silicon) method, while the trench isolation is formed by embedding, say, silicon oxide film into a trench which is formed so as to extend from an upper surface of the shallow isolation up to the insulating layer 9a through both shallow isolation and semiconductor layer 9b.

In the semiconductor layer 9b, desired semiconductor circuit components are formed in an active region surrounded with the above isolation region. In FIG. 5, as examples of such integrated circuit components there are shown a vertical npn-type bipolar transistor (NPN), a vertical pnp-type bipolar transistor (PNP), a Schottky barrier diode (SBD), and a semiconductor region N at an output of a circuit ("negative power-supply circuit" hereinafter) which is for generating a negative supply voltage.

On a main surface of the semiconductor layer 9b is deposited an insulating film, e.g., silicon oxide film. On the insulating film A are formed base electrodes B1, B2, emitter electrodes E1, E2 and collector electrodes C1, C2 of the foregoing bipolar transistors (NPN, PNP), an anode AN and a cathode K of the Schottky barrier diode (SBD), and a first-layer wiring line M1 which is connected to the output of the foregoing negative power-supply circuit.

These components B1, B2, E1, E2, C1, C2, AN, K, and M1 are formed of aluminum or aluminum alloy for example. On the insulating film A is deposited an insulating film A2 which is formed by silicon oxide film for example, and second-layer wiring lines M2 are formed on the insulating film A2.

A desired second-layer wiring line M2 is electrically connected to the first-layer wiring line M1 through a through-hole wiring line 9e. A surface protecting film A3 is deposited on the insulating film A2. The surface protecting film A3 is formed by silicon oxide film or by a stack of silicon oxide film and silicon nitride film on the silicon oxide film. A part of the surface protecting film A3 is opened, a part of the desired second-layer wiring line M2 is exposed to the opened portion, and a bonding pad 2a as a surface electrode is formed on the exposed portion.

This pad 2a is electrically connected through wire 4 to the tub 1b which is coated with palladium plating 6. According to the structure of this first embodiment, a negative supply voltage produced in the power-supply circuit within the chip is fed to the tub 1b and is further fed to the semiconductor substrate 9 as a base substrate.

In the semiconductor chip 2 of such a structure, when a negative voltage (say, −5V, with Vcc-side voltage being +5V, provided voltage values applied are not limited to those values) is applied to the semiconductor substrate 9 as a base substrate, holes present in the semiconductor substrate 9 are attracted to a negative potential side in the back surface of the semiconductor substrate and a depletion layer 9c formed at an interface of contact with the insulating layer 9a in the semiconductor substrate 9 extends in a direction away from the insulating layer 9a.

Consequently, a substantial insulating layer 9d corresponds to the sum of thickness of the insulating layer 9a and length of the depletion layer 9c, with the result that the distance between the semiconductor layer 9b and the semiconductor substrate 9, as well as the distance between the wiring lines M1, M2 and the semiconductor substrate 9, become long. Accordingly, the capacitance between the semiconductor layer 9b (to be exact, a diffusion layer) and the semiconductor substrate 9, as well as the capacitance between the wiring lines M1, M2 and the semiconductor substrate 9, can be decreases. As a result, it is possible to improve the operation speed of QFP 1.

In QFP 1, moreover, since power is fed from the back surface 2c of the semiconductor chip 1, the function of back power supply can be concentrated within the QFP body, thus eliminating the need of using an external circuit. Consequently, it is possible to reduce the mounting area and hence possible to reduce the product size.

As to the disconnection of wiring used for the back power supply, it can be eliminated in a sorting step which is carried out before product shipment, so it is possible to improve the product reliability. Besides, the wiring for the back power supply becomes short and is received within the package (QFP body), so that it is possible to diminish inductance and suppress noise.

Moreover, the back power supply aims at fixing potential and no electric current flows through the wiring, so it is not necessary to consider the resistance of junctions in die bonding and wire bonding portions.

Further, as to the assembling process, an existing technique can be utilized as it is and therefore, coupled with the unnecessity of using an external circuit, the reduction of cost can be attained.

The use of such an SOI substrate affords the merit that the operation speed can be improved, but there arises the necessity of taking a measure for improving the heat radiating performance because components' regions are insulated by the insulating layer 9a.

In this connection, since the insulating layer 9a on SOI substrate is thinner than the projective film (the sum of both surface protecting film A3 and insulating film A2 shown in FIG. 5) on the chip surface, the QFP 1 of this first embodiment adopts a structure wherein the heat generated is allowed to escape not to the chip surface side but to the back surface 2c side of the semiconductor chip 2, whereby the heat can be radiated efficiently.

In the QFP 1, moreover, a predetermined pad 2a (the one connected to the negative power-supply circuit) on the semiconductor chip 2 is connected with the tub 1b through wire 4 and the QFP 1 is assembled using a lead frame with the whole of the tub 1b coated with palladium plating 6, so it is no longer necessary to perform Ag plating for wire bonding, and wire bonding can be done anywhere of the tub 1b and suspension leads 1e at the time of conducting the back power supply, with the result that wire bonding conditions can be moderated.

Next, with reference to FIG. 6, a description will be given below about a method of manufacturing the QFP 1 of this first embodiment.

First, dicing (step S1) shown in FIG. 6 is performed to make division of the semiconductor substrate 9 into individual chips.

Subsequently, die sorting of step S2 is performed to pick up the individual semiconductor chips 2.

On the other hand, there is provided a lead frame wherein the whole surfaces of tub 1b, inner leads 1g and outer leads 1h are coated with palladium plating 6 and suspension leads 1e are formed with stepped portions 1d.

Thereafter, pellet bonding of step S3 is performed. In this step, Ag paste 7 is applied to a chip bonding surface 1c of the tub 1b and the semiconductor chip 2 is placed thereon.

Then, wire bonding of step S4 is performed.

More specifically, pads 2a on the semiconductor chip 2 and corresponding inner leads 1g are connected together using wires 4.

Further, a pad 2a capable of being applied with a negative voltage on the semiconductor chip 2 and the tub 1b or the stepped portion 1d of a suspension lead 1e are connected together using wire 4.

Subsequently, there is performed molding of step S5.

In this step, the semiconductor chip 2 is sealed with resin so that a back surface 1a of the tub 1b is exposed, to form a sealing member 3.

As a result, as shown in FIG. 1, the back surface 1a of the tub 1b is exposed to a surface 3b of the sealing member 3, and the exposed back surface 1a and the outer leads 1h are coated with palladium plating 6.

Thereafter, lead cutting is performed in step S6.

More specifically, plural outer leads 1h and suspension leads 1e are cut to let the base metal be exposed to cut faces 1f of the outer leads 1h and suspension leads 1e, and the leads 1h and 1e are separated from the lead frame.

The outer leads 1h are not only cut but also bent in a gull wing shape. In this first embodiment, the outer leads 1h are bent in a direction away from the tub 1b, i.e., in a direction opposite to the tub.

Then, marking is performed in step S7 to put a desired mark on QFP 1.

Now, the assembly of QFP 1 is completed.

In the QFP 1, the cut faces 1f of the outer leads 1h and suspension leads 1e are not coated with palladium plating 6, but the whole of the other lead portions, including the tub 1b, is coated with palladium plating 6.

Thus, in assembling the QFP 1 of this first embodiment, the assembling work is done using a lead frame pre-coated throughout the whole surface thereof with palladium plating 6, so it is not necessary to go through the conventional exterior solder plating step after molding, thus permitting simplification of the assembling process.

The following description is now provided about QFPs 1 according to modifications of the first embodiment.

The QFPs 1 according to the modifications, which are shown in FIGS. 7 to 12, each incorporate a semiconductor chip 2 formed using an SOI substrate. Therefore, a predetermined pad 2a capable of being applied with a negative voltage on the semiconductor chip 2 and a tub 1b or a suspension lead 1e are connected with each other using wire 4.

The QFPs 1 according to the modifications shown in FIGS. 7 to 12 are each also a back power supply type, provided a tub 1b is disposed below the semiconductor chip 2 and is embedded in a sealing member 3, that is, the tub 1b is of an unexposed structure.

According to the structure of the QFP 1 shown in FIGS. 7 and 8, wire 4 is connected to the tub 1b itself.

In the QFP 1 shown in FIGS. 9 and 10, suspension leads 1e of the tub 1b are positioned nearly centrally of two opposed sides and are bent in the same shape as inner and outer leads 1g, 1h, with wires 4 being connected to stepped portions 1d of the suspension leads 1e.

Further, the QFP 1 shown in FIGS. 11 and 12 are of a structure in which wire 4 is connected to a suspension lead 4e which supports the tub 1b.

In all of the QFPs 1 according to the modifications shown in FIGS. 7 to 12, it is possible to effect a back power supply.

Next, a description will be given below about in what state the heat radiation fins 5 used in the QFP1 of the first embodiment are mounted.

In the QFP 1 of the first embodiment shown in FIGS. 1 to 4, a heat radiation fin 5 may be attached to the back surface 1a of the tub 1b to improve the heat radiating performance.

In the structure shown in FIGS. 13 and 14, a heat radiation fin 5 is attached to each of plural QFPs 1 which are mounted on both surface and back of a mounting substrate 10.

In the structure shown in FIGS. 15 and 16, an integral type large-sized heat radiation fin 11 is attached to plural QFPs 1 mounted on both surface and back of a mounting substrate 10.

In the QFP 1 shown in FIGS. 1 to 4, since the back side 1a of the tub 1b is exposed to the surface 3b side of the sealing member 3, such an integral type large-sized heat radiation fin 11 as shown in FIGS. 15 and 16 can be attached to plural QFPs 1 on the packaging substrate 10.

As means for further enhancing the heat radiating performance of QFP 1, for example a Peltier element for cooling may be attached to the exposed back surface 1a of the tub 1b in QFP 1, or a water cooling device such as a water cooling jacket may be installed.

There may be used a cooling device wherein an inert liquid such as fluorinert is brought into contact with the tub 1b to effect cooling.

Or a heater for raising temperature or a heater for retaining temperature may be attached to the tub 1b. Further, a temperature sensor may be installed.

Thus, in the QFP 1 shown in FIGS. 1 to 4, since the back surface 1a of the tub 1b is exposed to the surface 3b side of the sealing member 3, various cooling means and temperature sensor means can be attached to the tub 1b.

(Second Embodiment)

Figure 17:
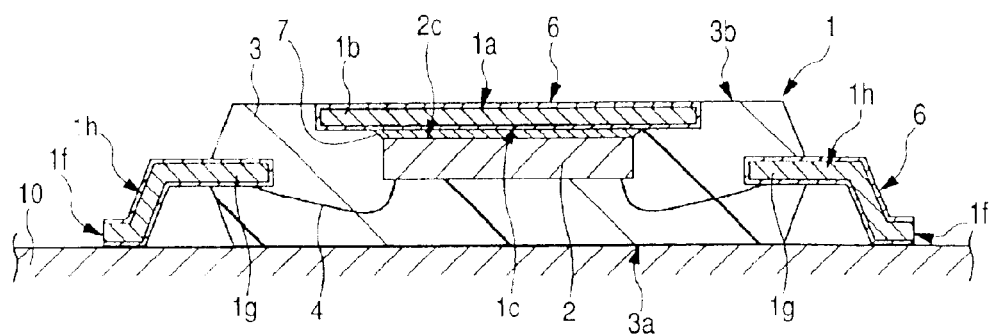
FIG. 17 is a sectional view showing a structural example of a semiconductor device according to a second embodiment of the present invention.
Figure 18:
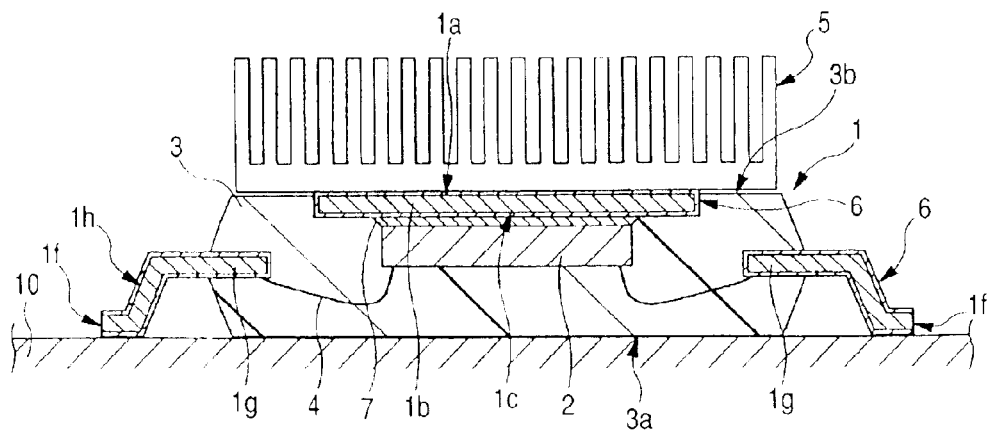
FIG. 18 is a sectional view showing the structure of a semiconductor device according to a modification of the second embodiment of the invention.

FIG. 17 is a sectional view showing a structural example of a semiconductor device according to a second embodiment of the present invention, FIG. 18 is a sectional view showing the structure of a semiconductor device according to a modification of the second embodiment of the invention, and FIG. 19 is a sectional view showing the structure of a semiconductor device according to another modification of the second embodiment of the invention.

Like the QFP 1 of the first embodiment, the semiconductor device of this first embodiment is of a structure in which a back surface 1a of a tub 1b is exposed to a surface 3b side of a sealing member 3 and the surfaces of leads are all coated with palladium plating 6 except the cut faces 1f of outer leads 1h and suspension leads 1e (see FIG. 4).

In the structure of this second embodiment, however, a back power supply to a semiconductor chip 2 is not performed.

FIG. 17 illustrates a QFP 1 of a structure wherein a back surface 1a of a tub 1b is exposed, as well as a mounted state thereof. The back surface 1a of the tub 1b is exposed to a surface 3b side of a sealing member 3 and outer leads 1h are soldered to substrate terminals of a mounting substrate 10.

As explained also regarding the first embodiment, since the tub 1b is exposed to the surface side of the sealing member 3, heat radiation members of various shapes and sizes can be attached to the exposed back surface 1a through palladium plating 6. As in the package structure of FIG. 1 described in the first embodiment, a heat radiating (cooling) method for QFP 1 can be made versatile. Moreover, a lead-free state can be realized because solder plating is not adopted.

In a QFP 1 shown in FIG. 18, a heat radiation fin 5 as a heat radiation member is attached to a back surface 1a of a tub 1b. This structure permits a further improvement of the heat radiating performance in comparison with the QFP 1 shown in FIG. 17.

Further, in a QFP 1 shown in FIG. 19, a thin thermal diffusion plate 8 as a heat radiation member is attached to a back surface 1a of a tub 1b. According to this QFP 1 it is possible to realize a thin heat radiation structure as compared with the QFP 1 shown in FIG. 18.

Also in the QFPs 1 of the second embodiment and modifications thereof illustrated in FIGS. 17 to 19, as in the QFP 1 of the first embodiment illustrated in FIG. 1, since heat is radiated upward of the sealing member 3, it is possible to diminish the influence of heat on peripheral components of each QFP 1 mounted on the mounting substrate 10 and hence possible to improve the packaging density in the peripheral area of QFP 1.

Consequently, it is possible to diminish the mounting area for the mounting substrate 10 and hence possible to not only improve the mounting efficiency but also attain the reduction in size of product and consequent reduction in cost of product.

Although the present invention has been described above concretely by way of embodiments thereof, it goes without saying that the present invention is not limited to the above embodiments, but that various changes may be made within the scope not departing from the gist of the invention.

For example, in the above first and second embodiments the lead surfaces are all coated with palladium plating 6 except the cut faces 1f of outer leads 1h and suspension leads 1e, but in the case where the back surface 1a of the tub 1b in QFP 1 is exposed to either the surface 3b or the back surface 3a of the sealing member 3, it suffices for at least the exposed back surface 1a to be coated with palladium plating 6.

Although in the above first embodiment the semiconductor chip 2 is formed from an SOI substrate, this constitutes no limitation. For example, the semiconductor chip 2 may be formed using a DI (Dielectric Isolation) substrate which is a high voltage-resistant substrate.

Although the semiconductor devices of the above first and second embodiments are QFPs 1, they may be other packages than QFPs, such as QFJs (Quad Flat J-leaded Packages) or SOP (Small Outline Packages) insofar as they are a resin-sealed type assembled using a lead frame and have a structure provided with a tub 1b.

[Effect of the Invention]

The following is a brief description of effects obtained by typical modes of the present invention disclosed herein.

The back surface of the tub exposed from the sealing member is coated with palladium plating, so even if a heat radiation member is attached to the back surface of the tub, the palladium plating does not melt during solder reflow for example, whereby it is possible to prevent a lowering of reliability in the mounting of a heat radiation member. As a result, it is possible to prevent the heat radiation member from falling off during solder reflow and improve the reliability of the semiconductor device.

What is claimed is:

1. A semiconductor device comprising:
    a semiconductor chip with a semiconductor integrated circuit formed thereon;
    a sealing member which seals the semiconductor chip with resin;
    a tub having a chip bonding surface bonded with the semiconductor chip and a back surface located on a side opposite to the chip bonding surface and exposed from the sealing member;
    a plurality of inner leads electrically connected respectively to surface electrodes of the semiconductor chip; and
    a plurality of outer leads integrally connected respectively to the inner leads and projecting to an exterior of the sealing member;
    wherein all surfaces of the tub and the plural inner leads and the plural outer leads, other than cut faces of the plural outer leads, are coated with palladium plating, and at least one of the surface electrodes of the semiconductor chip is connected with a corresponding one of said plural inner leads, through the palladium plating of said corresponding inner lead, using a metal thin wire.

2. A semiconductor device according to claim 1, wherein the semiconductor chip comprises a base substrate, a semiconductor layer formed on the base substrate through an insulating layer, and a semiconductor element formed on the semiconductor layer.

3. A semiconductor device according to claim 1, wherein the tub is supported by suspension leads of which all surfaces other than cut faces are coated with palladium plating, and a surface electrode of the semiconductor chip is connected with one of said tub suspension leads, through the palladium plating of said one of said tub suspension leads, using a metal thin wire.

4. A semiconductor device according to claim 1, wherein the tub is supported by suspension leads, the suspension leads being each formed with a stepped portion which is embedded in the sealing member.

5. A semiconductor device according to claim 1, wherein a heat radiation member is attached to the back surface of the tub.

6. A semiconductor device according to claim 5, wherein a heat radiation fin is attached as the heat radiation member.

7. A semiconductor device according to claim 5, wherein a thermal diffusion plate is attached as the heat radiation member.

8. A semiconductor device according to claim 1,
wherein the semiconductor chip comprises a P⁻ type semiconductor substrate as a base substrate, a semiconductor layer formed on the semiconductor substrate through an insulating layer, and a semiconductor element formed on the semiconductor layer; and
wherein a negative voltage is applied from a surface electrode on the semiconductor chip, via a metal thin wire and the tub, to a back surface of the semiconductor substrate.

9. A semiconductor device comprising:
a semiconductor chip with a semiconductor integrated circuit formed thereon;
a sealing member which seals the semiconductor chip with resin;
a tub having a chip bonding surface bonded with the semiconductor chip and a back surface located on a side opposite to the chip bonding surface and exposed from the sealing member;
a plurality of inner leads electrically connected respectively to surface electrodes of the semiconductor chip; and
a plurality of outer leads integrally connected respectively to the inner leads and projecting to the exterior of the sealing member;
wherein the back surface of the tub is coated with palladium plating, and
wherein a heat dissipating member is bonded to the palladium plating on the back surface of the tub with a bonding material having a lower melting temperature than the palladium plating.

10. A semiconductor device according to claim 9, wherein said bonding material is a solder material.

11. A semiconductor device according to claim 9,
wherein the semiconductor chip comprises a P⁻ type semiconductor substrate as a base substrate, a semiconductor layer formed on the semiconductor substrate through an insulating layer, and a semiconductor element formed on the semiconductor layer; and
wherein a negative voltage is applied from a surface electrode on the semiconductor chip, via a metal thin wire and the tub, to a back surface of the semiconductor substrate.

12. A semiconductor device according to claim 1,
wherein a heat dissipating member is bonded to the palladium plating on the back surface of the tub with a bonding material having a lower melting temperature than the palladium plating.

13. A semiconductor device according to claim 12, wherein said bonding material is a solder material.

* * * * *